(12) United States Patent
Rodinger et al.

(10) Patent No.: US 11,195,821 B2
(45) Date of Patent: Dec. 7, 2021

(54) LED PACKAGING UNIT, LED LAMP COMPRISING SAME, AND METHOD OF THE MANUFACTURE SAME

(71) Applicant: NanoGrid Limited, Hong Kong (CN)

(72) Inventors: Tomas Rodinger, Shenzhen (CN); Guoping Kang, Shenzhen (CN); Mingjian Liu, Shenzhen (CN)

(73) Assignee: NanoGrid Limited, Hong Kong (HK)

( * ) Notice: Subject to any disclaimer, the term of this patent is extended or adjusted under 35 U.S.C. 154(b) by 96 days.

(21) Appl. No.: 16/679,274

(22) Filed: Nov. 10, 2019

(65) Prior Publication Data

US 2021/0098429 A1    Apr. 1, 2021

(30) Foreign Application Priority Data

Sep. 26, 2019    (CN) .......................... 201910919531.3

(51) Int. Cl.
*H01L 33/62*    (2010.01)
*H01L 33/64*    (2010.01)
*H01L 25/075*   (2006.01)
*H01L 33/48*    (2010.01)
*F21V 8/00*     (2006.01)

(52) U.S. Cl.
CPC ........ *H01L 25/0753* (2013.01); *H01L 33/483* (2013.01); *H01L 33/62* (2013.01); *H01L 33/644* (2013.01); *G02B 6/009* (2013.01); *G02B 6/0073* (2013.01); *H01L 33/486* (2013.01)

(58) Field of Classification Search
CPC ... H01L 25/0753; H01L 33/62; H01L 33/644; H01L 33/483

USPC ............................................. 257/89; 362/231
See application file for complete search history.

(56) References Cited

U.S. PATENT DOCUMENTS

| | | | |
|---|---|---|---|
| 8,480,251 B2 * | 7/2013 | Park | F21K 9/60 362/241 |
| 10,362,651 B2 | 7/2019 | Hsiang et al. | |
| 2014/0334144 A1 * | 11/2014 | Matsuura | G02F 1/133603 362/231 |
| 2017/0307937 A1 * | 10/2017 | Matsuura | G09G 3/3413 |

FOREIGN PATENT DOCUMENTS

| | | |
|---|---|---|
| CN | 206269090 U | 6/2017 |
| WO | WO2017/181291 A1 | 10/2017 |
| WO | WO201 9/052294 A1 | 12/2018 |

* cited by examiner

*Primary Examiner* — David Vu
*Assistant Examiner* — Brandon C Fox
(74) *Attorney, Agent, or Firm* — Melvin Li

(57) ABSTRACT

The present invention is concerned with an LED packaging unit, a manufacturing method for the same, and an LED lamp. The LED packaging unit has a common substrate, N number of red LED chips, M number of green LED chips and X number of blue LED chips. The N number of red LED chips, the M number of green LED chips and the X number of blue LED chips are arranged and packaged on a bottom surface of a recess of the common substrate. The red LED chips, the green LED chips and the blue LED chips are all monochromatic LED chips, with N, M, and X being integers greater than 1. The distances between any adjacent two red LED chips (or green LED chips or blue LED chips) are substantially consistent.

25 Claims, 3 Drawing Sheets

LED PACKAGING UNIT, LED LAMP COMPRISING SAME, AND METHOD OF THE MANUFACTURE SAME

CROSS REFERENCE TO RELATED APPLICATION

This application claims priority from earlier filed Chinese Patent Application No. 201910919531.3 filed Sep. 26, 2019, contents of which are incorporated herein in its entirety.

FIELD

The present invention relates to LED lighting, and particularly relates to an LED packaging unit, a manufacturing method of the same, and an LED lamp.

BACKGROUND

Packaging is a crucial phase in manufacturing light-emitting diodes (LEDs). The light-emitting mechanism of semiconductor materials determines that a single LED chip cannot emit a continuous spectrum of white light; therefore, to create white light, the processing requires mixing lights of two or more complementary colors. Conventionally, there are mainly three approaches to achieve a white LED: blue LED+YAG yellow phosphor, mixing light of RGB LEDs, and UV LED+polychromatic phosphors. With the approach of mixing light of RGB LEDs as an example, a conventional packaging unit only includes a single RGB LED chip due to packaging difficulty and light-mixed effect requirement; and a plurality of packaging units is to be utilized in order to meet the requirement of large-area illumination.

A packaged LED may be mounted to an LED panel lamp. After passing through a high-transmittance LGP (Light Guide Plate), light is created with a uniform planar illumination effect. Due to its uniform illuminance, softness, comfort and bright light emission, LED panel lamps have become mainstream indoor lighting lamps.

To ensure the intensity of exit light on the panel, conventional LED panel lamps usually require arranging a plurality of packaging units abreast on the panel, which, however, would possibly cause relatively large dark areas at corners of such panel lamps, while the dark corner areas seriously affect the luminous efficiency of panel lamps and the overall assembly effect.

The present invention seeks to address this problem, or at least to provide alternative to the public.

SUMMARY

With a view to solve the problem of conventional technologies in which a single LED packaging unit cannot provide a large-area illumination due to relatively large dark corner areas occurring at the corners of a lamp, one or more embodiments of an LED packaging unit in accordance with the present invention are provided. Some inventive features of the present invention can meet the requirement of large-area exit light with a single LED packaging unit and at the same time reduce the size of dark areas at the corners of panel-type lamps to a greater extent.

The present invention provides an LED packaging unit, comprising: a common substrate; and N number of red LED chips, M number of green LED chips, and X number of blue LED chips, the N number of red LED chips, the M number of green LED chips, and the X number of blue LED chips being arranged and packaged on the common substrate; wherein the red LED chips, the green LED chips, and the blue LED chips are all monochromatic LED chips, N, M, and X being integers greater than 1; wherein the distances between any adjacent two such red LED chips are substantially consistent or the same, the distances between any adjacent two such green LED chips are substantially consistent or the same, and the distances between any adjacent two blue LED chips are substantially consistent or the same; the red LED chips, the green LED chips, and the blue LED chips are arranged in such a manner that the sum of the distances from any monochromatic LED chip to all LED chips of other colors immediately adjacent thereto is substantially approximate to or equal to the sum of the distances from another monochromatic LED chip of the same color to all the LED chips of other colors immediately adjacent thereto.

In some embodiments in accordance with the present invention, the common substrate is provided and shaped with a recess, wherein the red LED chips, the green LED chips, and the blue LED chips are arranged and packaged on a substantially flat bottom surface of the recess.

In some embodiments in accordance with the present invention, the distances from respective red LED chips to corresponding green LED chips immediately adjacent thereto are substantially consistent; the distances from respective red LED chips to corresponding blue LED chips immediately adjacent thereto are substantially consistent; and the distances from respective green LED chips to corresponding blue LED chips immediately adjacent thereto are substantially consistent.

In some embodiments of the present invention the size of the bottom surface of the recess is equal to or less than 25 mm$^2$, or preferably 8-25 mm$^2$.

In some embodiments of the present invention, among the straight-line distances from any monochromatic luminous LED chip to a group of luminous LED chips of other colors immediately adjacent thereto, the maximum straight-line distance is within a range of 0.2 mm-2 mm.

In some embodiments of the present invention, the bottom surface of the recess is partitioned into N number, M number, and X number of areas respectively corresponding to the N number of red LED chips, the M number of green LED chips, and the X number of blue LED chips, wherein each luminous LED chip is disposed at the center of its corresponding area.

In some embodiments of the present invention, the range of size A of each of the areas is defined by the equation below:

$$A = S1/(N+M+X) * (70\% - 130\%);$$

where N, M, and X respectively refer to the number of red LED chips, the number of green LED chips, and the number of blue LED chips; and S1 refers to the size of the bottom surface of the recess.

In some embodiments of the present invention, the N is 6, the M is 4, and the X is 4.

In some embodiments of the present invention, the 6 red LED chips are all disposed above the 4 green LED chips, and the 4 green LED chips are all disposed above the 4 blue LED chips; and the 6 red LED chips are arranged substantially in a row, which are respectively: the first red LED chip, the second red LED chip, the third red LED chip, the fourth red LED chip, the fifth red LED chip, and the sixth red LED chip; the 4 green LED chips are arranged substantially in a row, which are respectively: the first green LED chip, the second green LED chip, the third green LED chip, and the fourth green LED chip; and the 4 blue LED chips are arranged substantially in a row, which are respectively: the first blue LED chip, the second blue LED chip, the third blue LED chip, and the fourth blue LED chip.

In some embodiments of the present invention, the distance between the first red LED chip and the second red LED chip is substantially equal to the distance between the fifth red LED chip and the sixth red LED chip; the distance between the second red LED chip and the third red LED chip is substantially equal to the distance between the fourth red LED chip and the fifth red LED chip.

In some embodiments of the present invention, the first green LED chip and the first blue LED chip are disposed between the first red LED chip and the second red LED chip; the fourth green LED chip and the fourth blue LED chip are disposed between the fifth red LED chip and the sixth red LED chip; the second and third green LED chips and the second and third blue LED chips are all disposed between the third red LED chip and the fourth red LED chip.

In some embodiments of the present invention, the N is 4, the M is 3, and the X is 3.

In some embodiments of the present invention, the 4 red LED chips are all disposed above the 3 green LED chips, and the 3 green LED chips are all disposed above the 3 blue LED chips; the 4 red LED chips are arranged substantially in a row, the 3 green LED chips are arranged substantially in a row, and the 3 blue LED chips are arranged substantially in a row.

In some embodiments of the present invention, the 4 red LED chips are arranged substantially at equal intervals, the 3 green LED chips are arranged substantially at equal intervals, and the 3 blue LED chips are arranged substantially at equal intervals.

In some embodiments of the present invention, the 3 green LED chips and the 3 blue LED chips are each disposed between two adjacent red LED chips.

In some embodiments of the present invention, on the bottom surface of the recess are further connected Y number of white LED chips at uniformly or spaced evenly, where Y is an integer greater than or equal to 1.

In some embodiments of the present invention, a sum of the distances from any white LED chip to the red LED chip, green LED chip, and blue chip immediately adjacent thereto is substantially approximate to or equal to the sum of the distances from another white LED chip to the red LED chip, green LED chip, and blue chip immediately adjacent thereto.

In some embodiments of the present invention, the white LED chips are packaged apart from the red LED chips, the green LED chips, and the blue LED chips.

In some embodiments of the present invention, the packaging unit comprises a plurality of electrode contacts, and respective LED chips are correspondingly connected, with uniform wiring, to the plurality of electrode contacts.

In some embodiments of the present invention, the widths of the plurality of electrode contacts are different from each other, and the number of LED chips correspondingly connected to each electrode contact is substantially proportional to the width of the electrode contact.

In some embodiments of the present invention, the range of width CL of each of the electrode contacts is defined by the equation below:

$$CL = \frac{L-d}{x} * n * (70\% \sim 130\%)$$

where x denotes the total number of LED chips;

L denotes the length of the edge where all electrode contacts are sifting on;

d denotes the dimension of blank space between two adjacent electrode contacts; and n denotes the number of LED chips included in each electrode contact area.

In some embodiments of the present invention, the packaging unit comprises at least two heat-dissipation contacts, and the heat-dissipation contacts are connected between the plurality of electrode contacts at even intervals.

The present invention further provides an LED lamp, comprising one or more LED packaging unit as mentioned above.

In some embodiments of the present invention, the LED lamp is an LED panel lamp.

In some embodiments of the present invention, the LED panel lamp comprises a polygonal panel, and a circuit board which is adapted to the profile of the panel and arranged together with the panel; wherein a plurality of the LED packaging units are disposed at corresponding corners of the panel and electrically connected to the circuit board.

In some embodiments, the plurality of LED packaging units are configured to be electrically connected onto the circuit board so as to reduce the overlapping area of the light emitted from adjacent two of the LED packaging units.

In some embodiments of the present invention, at a backlight position of each of the LED packaging units on the panel is formed a corner dark area, the size of each corner dark area being less than or equal to about 7 mm².

In some embodiments of the present disclosure, the size of each corner dark area of the panel is less than or equal to about 5 mm².

In some embodiments of the present invention, the size of each corner dark area is set to be substantially barely invisible to naked eyes when the lamp is energized in the luminous state, or set to an extent in which the naked eyes can only perceive a dark point or a dark strip.

The present invention further provides a method for manufacturing the LED packaging unit as mentioned above, comprising:

providing a common substrate, wherein a recess is arranged on the common substrate, the size of the bottom surface of the recess being less than about 25 mm²; and arranging and packaging a plurality of red LED chips, a plurality of green LED chips, and a plurality of blue LED chips on the common substrate, such that the sum of the distances from any monochromatic LED chip to all LED chips of other colors immediately adjacent thereto is substantially approximate to or equal to the sum of the distances from another LED chip of the same color as the monochromatic LED chip to all LEDs of other colors immediately adjacent thereto.

In some embodiments of the present invention, the method further comprises:

arranging and packaging a plurality of white LED chips on the common substrate in such a manner that the plurality of white LED chips are isolated from the plurality of red LED chips, the plurality of green LED chips, and the plurality of blue LED chips.

According to the present invention, by packaging the plurality of red LED chips, the plurality of green LED chips, and the plurality of blue LED chips onto the bottom surface of the recess of the common substrate with substantially consistent intervals between adjacent two of the plurality of LED chips, a higher light-emitting efficiency may be achieved on a single common substrate.

According to the present invention, the plurality of red LED chips, the plurality of green LED chips, and the plurality of blue LED chips are arranged in such a manner that the sum of the distances from any monochromatic LED chip to all LED chips of the other two colors immediately adjacent thereto is substantially approximate to or equal to the sum of the distances from another LED chip of the same color as the monochromatic LED chip to all LEDs of the other two colors immediately adjacent thereto. Such a configuration guarantees uniformity of the mixed light and emits more uniform white light; moreover, configuration of the plurality of luminous LED chips offers a higher luminous intensity and thereby may meet the requirement of a larger exit light area; additionally, as the plurality of LED chips are all integrated onto a single common substrate, the entire packaging structure has a higher integration degree and a higher unit-area light flux.

BRIEF DESCRIPTION OF THE DRAWINGS

To elucidate the technical solutions of the present disclosure, the drawings used in describing the embodiments of the present disclosure or the prior art will be briefly introduced below. It is apparent that the drawings as described only relate to some embodiments of the present disclosure. To those skilled in the art, other drawings may be derived based on these drawings without exercise of inventive work, wherein.

In the drawings, same reference numerals represent same features.

Figure 1:
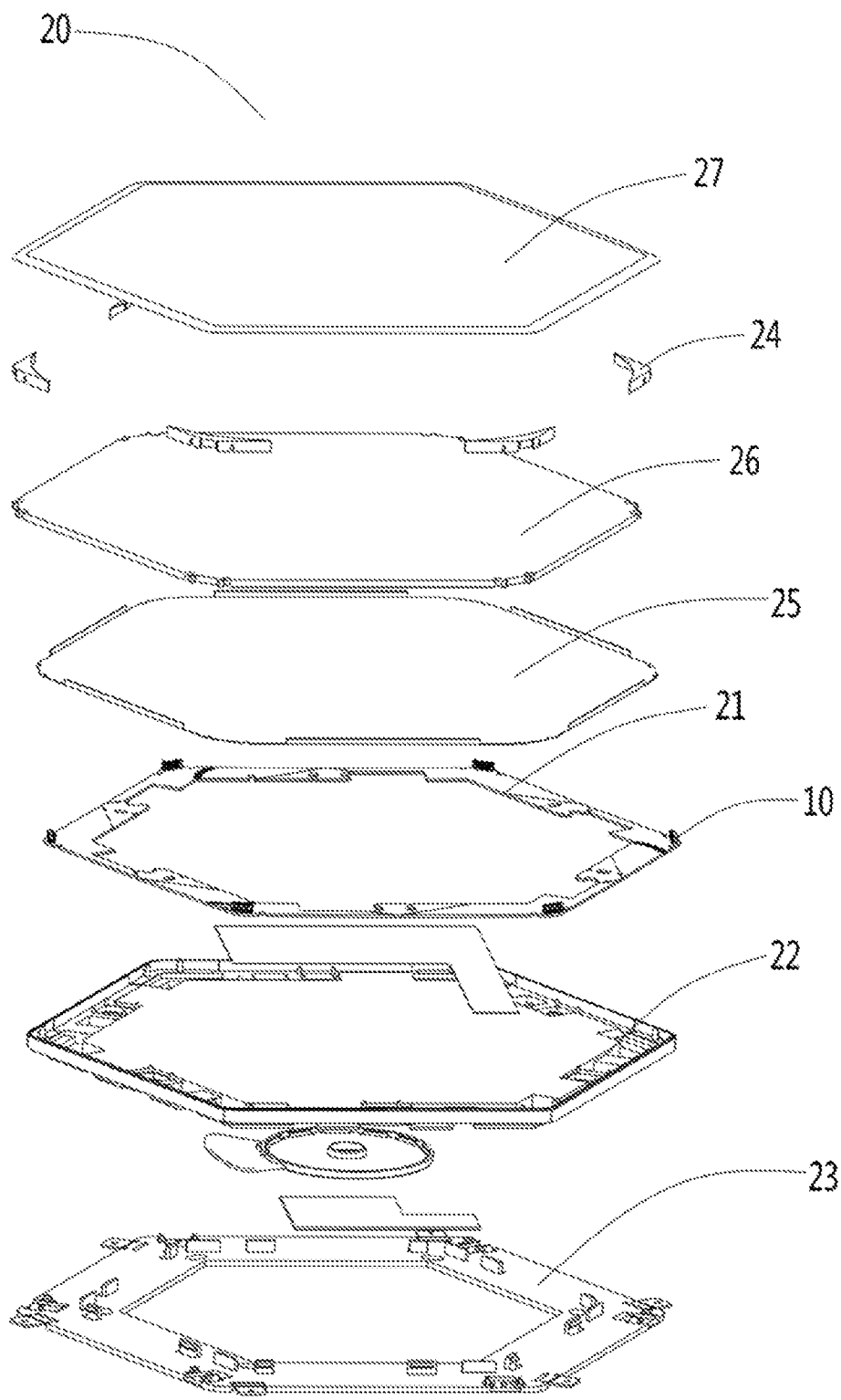
FIG. 1 is an exploded view of an LED panel lamp according to an embodiment of the present disclosure.

10—packaging unit; 11—common substrate; 12—bottom surface; 13—red LED chip; 14—green LED chip; 15—blue LED chip; 16—white LED chip; 17—gold wire; 18—isolator; 19—electrode contact; 191—charged contact; 192—heat-dissipation contact; 20—panel lamp; 21—circuit board; 22—rear cover; 23—support frame; 24—light shielding sheet; 25—reflector; 26—light guide plate; 27—diffuser; 30—corner dark area.

DETAILED DESCRIPTION OF EMBODIMENTS

With a view to clearly illustrate the objects, technical solutions, and advantages of the present disclosure, the present invention will be described in detail with reference to the accompanying drawings and the embodiments. It should be understood that the preferred embodiments described herein are only for the purpose of explanation, and is not intended to limit, or should be not considered as limiting, to the scope of the invention.

It is to be noted that when an element is described as "being fixed to" or "disposed at" another element, it may be disposed directly or indirectly on said another element. When an element is described as "being connected to" another element, it may be directly or indirectly connected to said another element.

In the description of the present disclosure, it is to be understood that orientation or locational relationships indicated by the terms "length," "width," "upper," "lower," "front," "rear," "left," "right," "vertical," "horizontal," "top," "bottom," "inner," "outer," etc. are the orientation or locational relationships illustrated in the drawings, and they are intended only for facilitating and simplifying description of the present application, and not for indicating or implying that illustrated devices or elements must assume such specific orientations and must be configured and operated with those specific orientations; therefore, they should not be construed as limitations to the present application.

Besides, the terms "first" and "second" are only used for descriptive purposes, which shall not be construed as indicating or implying their relative importance or implicitly indicating the number of technical features. Therefore, the features defined by "first" and "second" may explicitly or implicitly include one or more of such features. In the description of the present disclosure, unless otherwise indicated, "plurality" indicates two or more.

According to an embodiment of the present disclosure, as shown in FIGS. 1 to 5, there is provided an LED packaging unit 10, comprising: a common substrate 11 which is preferably of a bowl-shape or similar structure.

Figure 3:
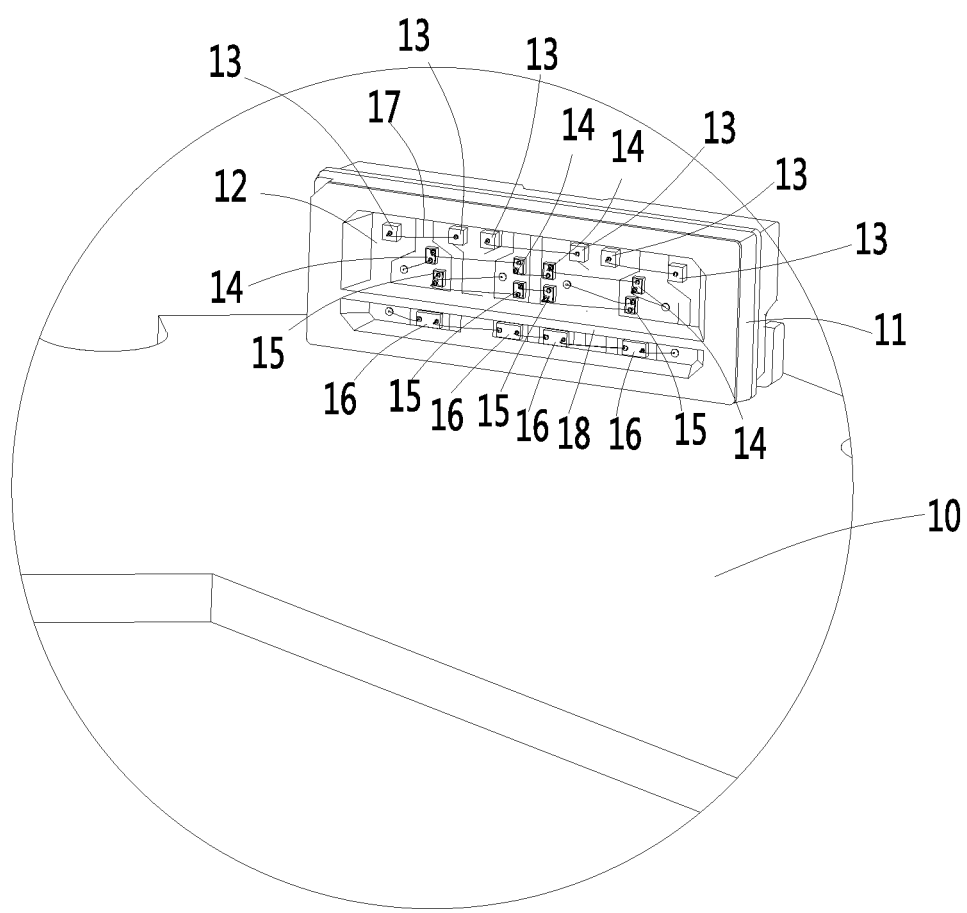
FIG. 3 is an enlarged view of part A in FIG. 2.
Figure 5:
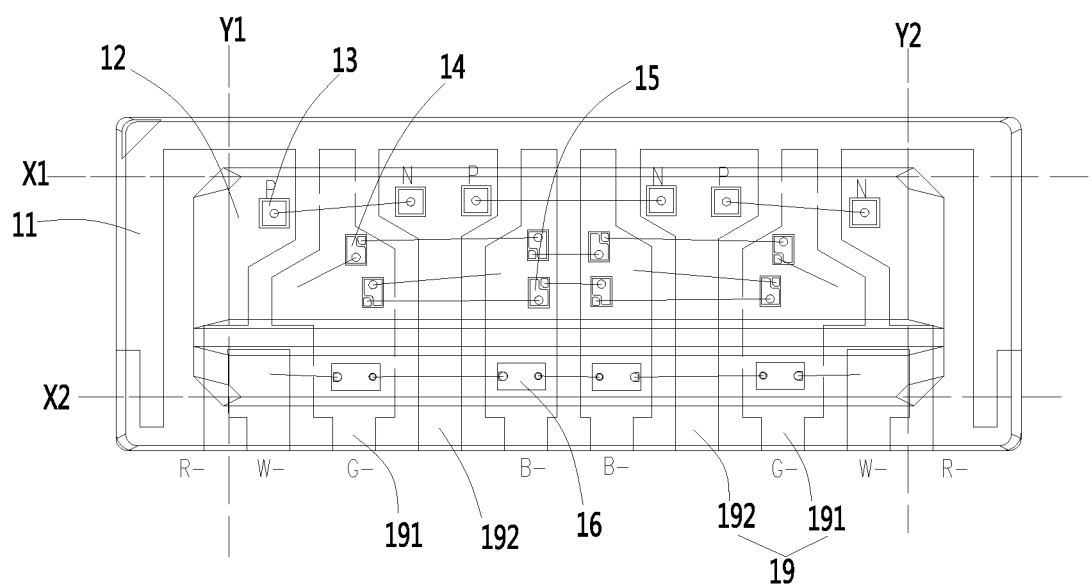
FIG. 5 is a front view of the LED packaging unit, wherein the common area enclosed by X1X2 and Y1Y2 is the area of the bottom surface of the recess in the present application.

As indicated in FIGS. 3 and 5, a plurality of red LED chips 13, a plurality of green LED chips 14, a plurality of blue LED chips 15 are respectively arranged at even intervals on the bottom surface 12 of the recess of the common substrate 11. LED chips of the same color are arranged in a row along a longitudinal length thereof and spaced evenly. Suppose that the number of red LED chips is N, the number of green LED chips is M and the number of blue LED chips is X, where N, M, and X are all integers greater than 1. In other words, the plurality of red LED chips 13, the plurality of green LED chips 14, and the plurality of blue LED chips 15 are respectively arranged at even intervals on the bottom surface 12 of the recess of the common substrate 11 of the packaging unit 10.

According to other embodiments of the present disclosure, the red-light, the green-light, and the blue LED chips may also be LED chips emitting other colors of light, e.g., yellow LED chips, purple LED chips, etc., specifically dependent on the desired color of mixed light.

In the embodiments of the present disclosure, as shown in FIG. 5, the size of the bottom surface 12 of the recess is preferably less than 25 mm$^2$, further preferably less than 4.9 mm*4.9 mm.

According to the embodiments of the present disclosure, the values of N, M, and X are correlated in such a manner that the red LED chips 13, the green LED chips 14, and the blue LED chips 15 may be uniformly mixed to create white light.

According to an embodiment of the present disclosure, as shown in FIGS. 3 and 5, the intervals between adjacent two of the plurality of red LED chips 13 are substantially consistent, the intervals between adjacent two of the plurality of green LED chips 14 are substantially consistent, and the intervals between adjacent two of the plurality of blue LED chips 15 are substantially consistent, which can guarantee uniformity of the mixed light.

Meanwhile, according to an embodiment of the present disclosure, the plurality of red LED chips 13, the plurality of green LED chips 14, and the plurality of blue LED chips 15 are configured in such a manner that the sum of the distances from any monochromatic LED chip to all LED chips of the other two colors immediately adjacent thereto is equal to the sum of the distances from another LED chip of the same color as the monochromatic LED chip to all LEDs of the other two colors immediately adjacent thereto. In other words, supposing the distance between a red LED chip 13 and an green LED chip 14 immediately adjacent thereto is A1 and the distance between the red LED chip 13 and an blue LED chip 15 immediately adjacent thereto is A2; the distance between another red LED chip 13 and an green LED chip 14 immediately adjacent thereto is B1, and the distance between said another red LED chip 13 and an blue LED chip 15 immediately adjacent thereto is B2; then, A1+A2=B1+B2. Additionally, supposing the distance between a green LED chip 14 and the red LED chip 13 immediately adjacent thereto is A1 and the distance between the green LED chip 14 and the blue LED chip 15 immediately adjacent thereto is C2; the distance between another green LED chip 14 and the green LED chip 14 immediately adjacent thereto is B1, and the distance between said another green LED chip 14 and the blue LED chip 15 immediately adjacent thereto is D2; then, A1+C2=B1+D2.

According to another embodiment of the present disclosure, the plurality of red LED chips 13, the plurality of green LED chips 14, and the plurality of blue LED chips 15 are configured in such a manner that the sum of the distances from any monochromatic LED chip to all LED chips of the other two colors immediately adjacent thereto is substantially approximate to the sum of the distances from another LED chip of the same color as the monochromatic LED chip to all LEDs of the other two colors immediately adjacent thereto. In other words, supposing the distance between a red LED chip 13 and an green LED chip 14 immediately adjacent thereto is A1 and the distance between the red LED chip 13 and an blue LED chip 15 immediately adjacent thereto is A2; the distance between another red LED chip 13 and an green LED chip 14 immediately adjacent thereto is B1, and the distance between said another red LED chip 13 and an blue LED chip 15 immediately adjacent thereto is B2; then, A1+A2≈B1+B2.

Supposing the distance between a green LED chip 14 and the red LED chip 13 immediately adjacent thereto is A1 and the distance between the green LED chip 14 and the blue LED chip 15 immediately adjacent thereto is C2; the distance between another green LED chip 14 and the green LED chip 14 immediately adjacent thereto is B1, and the distance between said another green LED chip 14 and the blue LED chip 15 immediately adjacent thereto is D2; then, A1+C2≈B1+D2.

The above arrangements guarantee uniformity of light-mixing ratios among each group including immediately adjacent red-light chip 13, green-light chip 14, and blue LED chip 15 and uniformity of the light-mixed effect, which further guarantees uniformity of exit light.

According to an embodiment of the present disclosure, the bottom surface of the recess of the common substrate may be preferably regarded as being partitionable into a plurality of areas, and each monochromatic LED chip (red, green or blue) is disposed at the exact center of a corresponding area. In this embodiment, the number of corresponding areas is preferably consistent with the number of the corresponding red-light chips, green-light chips, or blue LED chips, i.e., the bottom surface is partitioned into N number of areas, M number of areas, and X number of areas, respectively. It needs to be noted that in this embodiment, the size of each area is preferably substantially identical, or the shape of each area is substantially identical; such an arrangement can guarantee that the distances between each adjacent two luminous LED chips of the same color are substantially consistent, which may further guarantee uniformity of light mixing.

According to an embodiment of the present invention, the range of size A of each of the areas is defined by the equation below:

$$A = S1/(N+M+X)*(70\%\sim130\%);$$

where N, M, and X respectively refer to the number of red LED chips, the number of green LED chips, and the number of blue LED chips; and S1 refers to the size of the bottom surface of the recess.

As described above, in the embodiments of the present invention, the size of the bottom surface is less than 25 mm$^2$. For example, in an embodiment, the area is 24 mm$^2$; the value of N+M+X is 10; then, the range of Area A of each area is 2.4*(70%~130%) mm$^2$, i.e., 1.68 mm$^2$~3.12 mm$^2$. Of course, this numerical range is only an example for the embodiments of the present disclosure, not intended for limiting the present disclosure.

Further, in this embodiment, by packaging the plurality of red LED chips, the plurality of green LED chips, and the plurality of blue LED chips onto the bottom surface of the recess of the common substrate 11 with substantially consistent intervals between adjacent two of the plurality of LED chips, thereby further implementing a higher light-emitting efficiency on a single common substrate 11.

According to the present invention, the plurality of red LED chips 13, the plurality of green LED chips 14, and the plurality of blue LED chips 15 are arranged in such a manner that the sum of the distances from any monochromatic LED chip to all LED chips of the other two colors immediately adjacent thereto is substantially approximate to or equal to the sum of the distances from another LED chip of the same color as the monochromatic LED chip to all LEDs of the other two colors immediately adjacent thereto.

According to such a configuration, the luminous intensity of a single LED packaging unit of the present disclosure may be equivalent to that of five or more conventional packaging units; meanwhile, the space it occupies on the circuit board is far smaller than that occupied by five conventional packaging units. Such a configuration guarantees uniformity of light mixture and emits more uniform white light; moreover, configuration of a plurality of polychromatic LED chips offers an ever higher luminous intensity and thereby may meet the requirement of a larger exit light area.

Additionally, as the plurality of polychromatic LED chips are all integrated onto a single common substrate 11, the entire packaging structure has a higher integration degree and a higher unit-area light flux.

According to an embodiment of the present invention, the distance between any red LED chip 13 and the corresponding green LED chip 14 immediately adjacent thereto is identical or approximate to the distance between any other red LED chip 13 and the corresponding green LED chip 14 immediately adjacent thereto. In other words, the distance between each of the plurality of red LED chip 13 and the corresponding green LED chip 14 immediately adjacent thereto is identical or approximate to the distance between any other red LED chip 13 and the corresponding green LED chip 14 immediately adjacent thereto.

According to an embodiment of the present invention, the distance between any red LED chip 13 and the corresponding blue LED chip 15 immediately adjacent thereto is identical or approximate to the distance between any other red LED chip 13 and the corresponding blue LED chip 15 immediately adjacent thereto. In other words, the distance between each of the plurality of red LED chip 13 and the corresponding blue LED chip 15 immediately adjacent thereto is identical or approximate to the distance between any other red LED chip 13 and the corresponding blue LED chip 15 immediately adjacent thereto.

According to an embodiment of the present invention, the distance between any green LED chip 14 and the corresponding blue LED chip 15 immediately adjacent thereto is identical or approximate to the distance between any other green LED chip 14 and the corresponding blue LED chip 15 immediately adjacent thereto. In other words, the distance between each of the plurality of green LED chip 14 and the corresponding blue LED chip 15 immediately adjacent thereto is identical or approximate to the distance between any other green LED chip 14 and the corresponding blue LED chip 15 immediately adjacent thereto.

According to the above embodiments, the distances between any monochromatic LED chip and the corresponding luminous LED chips of other colors immediately adjacent thereto are identical or approximate, respectively.

In some embodiments of the present invention, the distance between any red LED chip 13 and the corresponding blue LED chip 15 immediately adjacent thereto is identical or approximate to the distance between any other red LED chip 13 and the corresponding blue LED chip 15 immediately adjacent thereto; the distance between any green LED chip 14 and the corresponding blue LED chip 15 immediately adjacent thereto is identical or approximate to the distance between any other green LED chip 14 and the corresponding blue LED chip 15 immediately adjacent thereto.

According to an embodiment of the present invention, among the straight-line distances from any red LED chip 13 to a group of immediately adjacent monochromatic LED chips of other colors, the maximum straight-line distance is within a range of 0.2 mm~2 mm. As shown FIG. 5 corresponding to this embodiment, the range of the vertical distance from any red LED chip 13 to the immediately adjacent blue LED chip 15 is 0.2 mm~2 mm. At this point, the vertical distance may be preferably 0.2 mm, 0.5 mm, 1 mm, 1.5 mm, and 2 mm. The light-mixture uniformity of the red-light, green-light, and blue LED chips and the overall size of the packaging unit 10 are affected by the vertical distance.

According to an embodiment of the present invention, as shown in FIGS. 3 and 5, on the common substrate 11, the number N of the red LED chips 13 is 6, the number M of the green LED chips 14 is 4, and the number X of the blue LED chips 15 is 4. That is, six red LED chips 13, 4 green chips 14, and 4 blue LED chips 15 are arranged at even intervals in the common substrate. Particularly, all of the red LED chips 13 are arranged in a straight line or substantially in a straight line; all of the green LED chips 14 are arranged in a straight line or substantially in a straight line; and all of the blue LED chips 15 are arranged in a straight line or substantially in a straight line. At this point, in the light-reflecting area are formed four light-mixing channels, wherein each light-mixing channel requires a 12 v voltage supply.

According to an embodiment of the present invention, as shown in FIGS. 3 and 5, the 6 red LED chips 13 are all disposed above the 4 green LED chips 14, and the 4 green LED chips 14 are all disposed above the 4 blue LED chips 15; and the 6 red LED chips 13 (as shown in FIG. 5) are arranged substantially in a row, which, from left to right, are respectively: the first red LED chip, the second red LED chip, the third red LED chip, the fourth red LED chip, the fifth red LED chip, and the sixth red LED chip.

The 4 green LED chips 14 are arranged substantially in a row, which, from left to right, are respectively: the first green LED chip, the second green LED chip, the third green LED chip, and the fourth green LED chip.

The 4 blue LED chips 15 are arranged substantially in a row, which, from left to right, are respectively: the first blue LED chip, the second blue LED chip, the third blue LED chip, and the fourth blue LED chip.

According to another embodiment of the present invention, as shown in FIGS. 3 and 5, the distance between the first red LED chip and the second red LED chip is substantially equal to the distance between the fifth red LED chip and the sixth red LED chip; the distance between the second red LED chip and the third red LED chip is substantially equal to the distance between the fourth red LED chip and the fifth red LED chip.

According to a further embodiment of the present invention, as shown in FIGS. 3 and 5, the first green LED chip and the first blue LED chip are disposed between the first red LED chip and the second red LED chip; the fourth green LED chip and the fourth blue LED chip are disposed between the fifth red LED chip and the sixth red LED chip; the second and third green LED chips and the second and third blue LED chips are all disposed between the third red LED chip and the fourth red LED chip. According to another embodiment of the present disclosure, the number N of the red LED chips 13 on the common substrate 11 is 4, the number M of the green LED chips 14 is 3, and the number X of the blue LED chips 15 is 3. That is, 4 red LED chips 13, 3 green LED chips 14, and 3 blue LED chips 15 are arranged at even intervals in the common substrate. Particularly, all of the red LED chips 13 are arranged in a straight line or substantially in a straight line; all of the green LED chips 14 are arranged in a straight line or substantially in a straight line; and all of the blue LED chips 15 are arranged in a straight line or substantially in a straight line. At this point, in the light-reflecting area are formed three light-mixing channels, wherein each light-mixing channel requires a 12 v voltage supply.

The arrangement patterns, positional relationships, and mutual sequential relationships of the 6 red LED chips 13, 4 green LED chips, and 4 blue LED chips may also be provided in other ways, which will not be listed here.

According to another embodiment of the present invention, (not shown) the 4 red LED chips 13 are all disposed above the 3 green LED chips 14, and the 3 green LED chips 14 are all disposed above the 3 blue LED chips 15; the 4 red LED chips 13 are arranged substantially in a row, the 3 green LED chips 14 are arranged substantially in a row, and the 3 blue LED chips 15 are arranged substantially in a row.

According to a further embodiment of the present invention, the 4 red LED chips 13 are arranged substantially at an even interval; the 3 green LED chips 14 are arranged substantially at an even interval; and the 3 green LED chips 15 are arranged substantially at an even interval.

According to a still further embodiment of the present invention, the 3 green LED chips 14 and the 3 blue LED chips 15 are each disposed between two adjacent red LED chips 13.

In this embodiment, the distances from any monochromatic LED chip to two luminous LED chips of the same color immediately adjacent thereto are identical or approximate, which may further enhance light mixture uniformity.

In an embodiment of the present invention, on the common substrate 11 are further connected Y number of white LED chips 16 at an even interval, where Y is an integer greater than 1. In this embodiment, the plurality of white LED chips 16 are preferably arranged abreast and arranged at an even interval on the bottom surface 12 of the recess, for enhancing the exit light intensity after the light from the red-light, green-light, and blue LED chips is mixed.

In the embodiments of the present invention, the number of white LED chips 16 is preferably identical to the number of blue or green LED chips 14.

According to an embodiment of the present invention, the sum of the distances from any white LED chip 16 respectively to the red LED chip 13, green LED chip 14, and blue LED chip 15 immediately adjacent thereto is identical or approximate to the sum of the distances from another white LED chip 16 respectively to the red LED chip 13, green LED chip 14, and blue LED chip 15 immediately adjacent thereto. In other words, suppose the distance between any white LED chip 16 and the red LED chip 13 immediately adjacent thereto is a1, the distance between the white LED chip 16 and the blue LED chip 14 immediately adjacent thereto is a2, and the distance between the white LED chip 16 and the blue LED chip 15 immediately adjacent thereto is a3. Suppose the distance between another white LED chip 16 and the re-light LED chip 13 immediately adjacent thereto is b1, the distance between said another white LED chip 16 and the green LED chip 14 immediately adjacent thereto is b2, and the distance between said another white LED chip 16 and the blue LED chip 15 immediately adjacent thereto is b3. Then, a1+a2+a3=/≈b1+b2+b3. Such an arrangement may achieve a higher exit light intensity and a higher light mixture uniformity.

According to an embodiment of the present disclosure, in the packaging unit 10, the plurality of white LED chips 16 are packaged apart from other colors of LED chips. The plurality of red LED chips 13, the plurality of green LED chips 14, and the plurality of blue LED chips 15 are packaged together. Of course, here, the plurality of white-color LED chips 16, the plurality of red LED chips 13, the plurality of green LED chips 14, and the plurality of blue LED chips 15 are all connected onto the bottom surface 12 of the recess of the common substrate 11. Moreover, in this embodiment, the plurality of red LED chips 13, the plurality of green LED chips 14, the plurality of blue LED chips 15 are isolated from the plurality of white LED chips 16 by isolators 18.

According to an embodiment of the present invention, the packaging unit 10 preferably comprises a plurality of electrode contacts 19, wherein the plurality of electrode contacts 19 are configured on the common substrate 11 so as to be connected to an external circuit board to thereby implement power supply to respective luminous LED chips. Additionally, the plurality of luminous LED chips are preferably connected onto the plurality of electrode contacts at even intervals. Further, the plurality of luminous LED chips include a plurality of red LED chips 13, a plurality of green LED chips 14, a plurality of blue LED chips 15, and a plurality of white LED chips 16.

According to an embodiment of the present invention, due to physical limitations, the number of luminous LED chips connected to some of the electrode contacts 19 is greater than other electrode contacts 19. As such, in this embodiment, due to different number of luminous LED chips connected onto the electrode contacts 19, the widths of the corresponding electrode contacts 19 are different, which facilitates heat dissipation of the electrode contacts. Preferably, in an embodiment of the present disclosure, the number of luminous LED chips on each of the electrode contact 19 is substantially proportional to the width of the electrode contact 19.

According to an embodiment of the present disclosure, the range of width (CL) of each of the electrode contacts 19 is defined by the equation below:

$$CL = \frac{L-d}{x} * n * (70\% \sim 130\%)$$

where x denotes the total number of all LED chips; L denotes the total length of the edge where all electrode contacts are exposed; d denotes a dimension of the blank space between two adjacent electrode contacts, wherein the blank space is not the distance between the centers of the two adjacent electrode contacts, but the size of the area between two adjacent electrode contacts, the area not belonging to any electrode contact; and n denotes the number of LED chips included in each electrode contact area.

According to an embodiment of the present invention, dependent on different numbers of actually connected luminous LED chips and different electrical connection relationships between the luminous LED chips, the corresponding electrode contacts 191 bear different electrical charges. Moreover, in the plurality of electrode contacts 19, at least two thereof have no electrical charges, which are configured as heat-dissipation contacts 192 via which heat generated by the common substrate 11 is rapidly conducted out, thereby rapidly cooling the packaging unit 10.

According to an embodiment of the present disclosure, the packaging unit 10 preferably includes two heat-dissipation contacts 192, and the two heat-dissipation contacts 192 are connected, at even intervals, between the plurality of electrode contacts with different electrical charges, thereby further guaranteeing more uniform heat dissipation.

Figure 2:
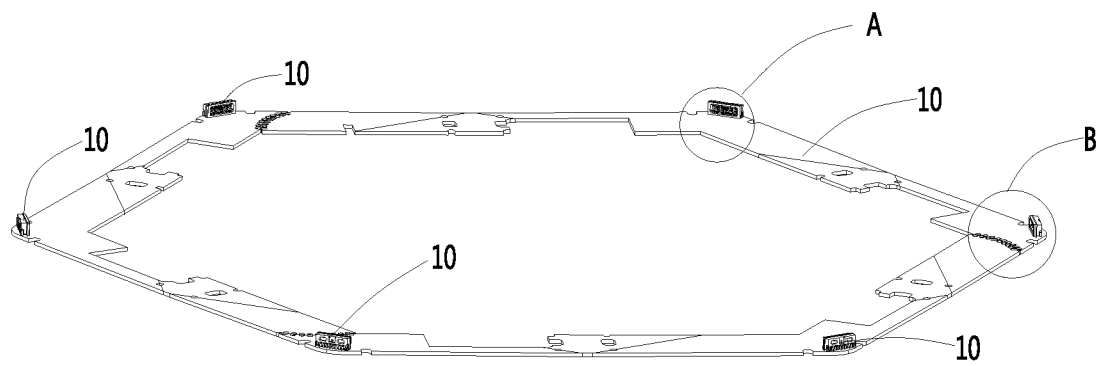
FIG. 2 is a connection structure diagram between a circuit board and an LED packaging unit in the LED panel lamp according to an embodiment of the present disclosure.

The present disclosure further provides an LED lamp, as shown in FIGS. 1 to 3, including the LED packaging unit 10 as mentioned above. LED lamp including the LED packaging unit may implement a smaller size with a more stable and uniform exit light.

According to an embodiment of the present disclosure, the LED lamp is preferably any one of a panel lamp, a desk lamp, a pendant lamp, or any other lamp which uses the LED packaging unit 10 as a light source.

According to a first embodiment of the present disclosure, the lamp is preferably a panel lamp 20. The lamp is preferably a polygonal panel lamp 20, and more preferably at least one of a triangular panel lamp, a quadrangular panel lamp, a hexagonal panel lamp 20, and an octagonal panel lamp.

In the embodiments of the present disclosure, the lamp comprises a polygonal lamp panel. The shape of the lamp panel is identical to the overall shape of the panel lamp 20. The lamp further comprises a rear cover 22 in fit connection with the lamp panel. The lamp further comprises a support frame 23 connected between the rear cover 22 and the lamp panel. The lamp further comprises a polygonal circuit board 21 connected on the support frame 23 and configured for electrically connecting a plurality of the LED packaging units 10. The lamp further comprises a light shielding sheet 24 disposed above the circuit board 21 and configured for preventing light leakage. The lamp further comprises a reflector 25 configured for reflecting the light emitted from the plurality of LED packaging units 10 to a light guide plate 26. The lamp further comprises a diffuser 27 disposed external to the light guide plate 26 in the exit light direction.

In the embodiments of the present disclosure, the support frame 23 is preferably connected to the interior bottom of the rear cover 22. The circuit board 21 is connected onto the support frame 23 and securely limited onto the support frame 23.

In the embodiments of the present disclosure, the LED packaging units 10 are preferably connected to corners of the circuit board 21, which may reduce the number of LED packaging units 10. Meanwhile, a plurality of the LED packaging units 10 are respectively connected to the corners of the circuit board; here, at each corner may be connected at least one LED packaging units 10. In this embodiment, one LED packaging unit 10 is connected to each corner; and the LED packaging unit 10 is configured to be electrically connected onto the circuit board so as to reduce the overlapping area of the light emitted from two adjacent light-emitting units.

Figure 4:
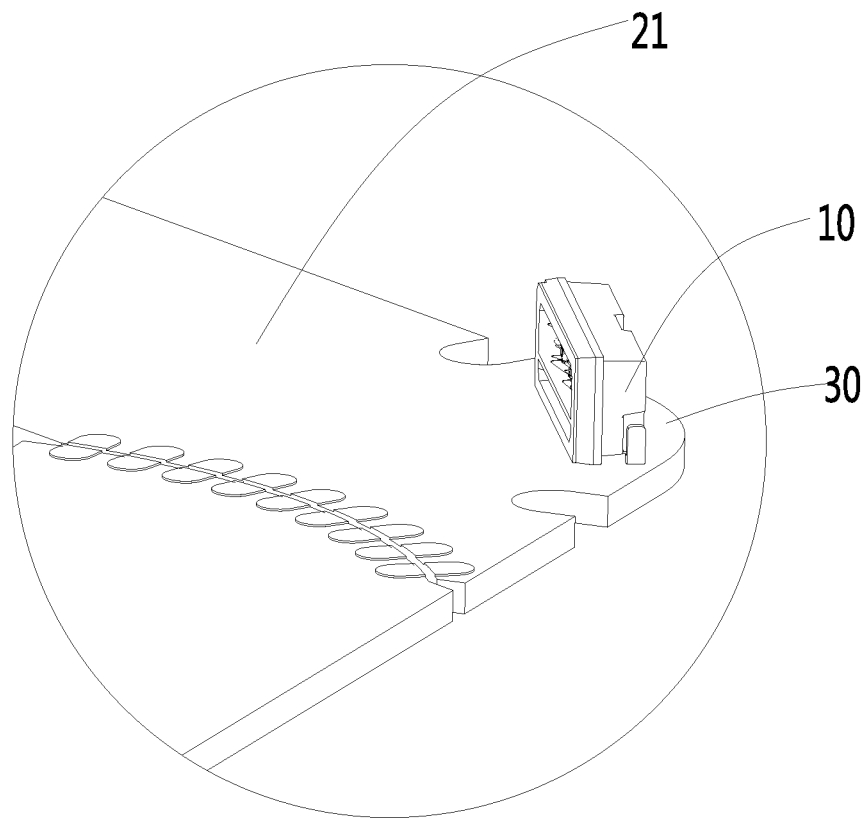
FIG. 4 is an enlarged view of part B in FIG. 3.

In the embodiments of the present disclosure, as shown in FIG. 4, each LED packaging unit 10 electrically connected on the circuit board 21 is mounted in an inclined manner so as to cause the overlapping area between the exit light areas of two adjacent LED packaging units 10 as smaller as possible. Regarding the "inclined" mount, with a triangular panel lamp 20 having three edges A, B, and C as an example, the mount position where the LED packaging unit 10 is electrically connected to the included angle formed between edge A and edge B should guarantee that the exit light direction of the LED packaging unit 10 does not exactly face edge C, but slightly skewed to edge A or edge B; meanwhile, the other LED packaging units 10 deflect a same angle towards a same direction to thereby guarantee uniformity of the exit light of the panel lamp 20. Here, the triangular panel lamp 20 is only an example. Embodiments of other shapes of panel lamp 20 may be inferred therefrom, which will not be detailed here.

In an embodiment of the present disclosure, as shown in FIG. 4, based on the shape of the panel lamp 20, the deflection angle of each LED packaging unit 10 is preferably 0°~10°, such that the exit light from the LED packaging units 10 at respective corners may spread across the whole panel lamp 20, except for the areas behind the respective LED packaging units 10, which are referred to as corner dark areas 30.

To achieve exit light intensity, conventional packaging LED beads are arranged abreast into a plurality of rows at the corners of a panel lamp so as to implement a relatively high exit light intensity. However, such a structural arrangement results in a relatively large corner dark area at each corner. In contrast, according to the design of the LED packaging unit 10 of the present disclosure, a plurality of monochromatic LED chips are integrated onto one common substrate 11 to thereby reduce the size of the corner dark areas 30 while ensuring luminous intensity.

In an embodiment of the present disclosure, the corner dark area 30 formed at each corner of the polygonal panel lamp is less than 7 mm$^2$, e.g., 6.9 mm$^2$, 6.5 mm$^2$, 6 mm$^2$, 5.5 mm$^2$, 5 mm$^2$, etc., far smaller than the corner dark area 30 on a conventional LED panel lamp.

According to an embodiment of the present disclosure, there is further provided a method of manufacturing the packaging unit 10 described above, comprising steps of:

Step 1: providing a common substrate 11, wherein a recess is arranged on the common substrate, the size of the bottom surface 12 of the recess being less than about 25 mm$^2$; and Step 2: sequentially connecting a plurality of red LED chips 13, a plurality of green LED chips 14, and a plurality of blue LED chips 15 on the common substrate 11.

In step 2, connections between the plurality of red LED chips 13, the plurality of green LED chips 14, and the plurality of blue LED chips 15 should ensure uniform light mixture and meanwhile cause the sum of the distances from any monochromatic LED chip to all LED chips of other colors immediately adjacent thereto to be substantially approximate to or equal to the sum of the distances from another LED chip of the same color as the monochromatic LED chip to all LEDs of other colors immediately adjacent thereto.

In other words, suppose the distance between any red LED chip 13 and the green LED chip 14 immediately adjacent thereto is A1 and the distance between the red LED chip 13 and the blue LED chip 15 immediately adjacent thereto is A2; the distance between another red LED chip 13 and the green LED chip 14 immediately adjacent thereto is B1, and the distance between said another red LED chip 13 and the blue LED chip 15 immediately adjacent thereto is B2; then, A1+A2=B1+B2. Suppose the distance between any green LED chip 14 and the red LED chip 13 immediately adjacent thereto is A1 and the distance between the green LED chip 14 and the blue LED chip 15 immediately adjacent thereto is C2; the distance between another green LED chip 14 and the green LED chip 14 immediately adjacent thereto is B1, and the distance between said another green LED chip 14 and the blue LED chip 15 immediately adjacent thereto is D2; then, A1+C2=B1+D2.

Step 3: connecting the plurality of red LED chips 13, the plurality of green LED chips 14, and the plurality of blue LED chips 15 via gold wires 17 such that LED chips of the same color are electrically connected with each other or electrically connected onto the common substrate 11, thereby implementing electrical connection between LED chips of respective colors.

Step 4: performing power-on test on the electrically connected red LED chips 13, green LED chips 14, and blue LED chips 15.

In Step 4, the power-on test may be conducted simultaneously with the electrical connection process of Step 3 or conducted after completion of the electrical connection.

Step 5: packaging, by glue injection, the plurality of red LED chips 13, the plurality of green LED chips 14, and the plurality of blue LED chips 15 onto the common substrate 11. At this point, the packaging glue adopts clear glue, and the packaging and curing utilizes a conventional packaging process.

According to another embodiment of the present disclosure, the packaging method further comprises:

fixing a plurality of white LED chips 16 onto the common substrate 11 in such a manner that the plurality of white LED chips 16 are spaced apart from the plurality of red LED chips 13, the plurality of green LED chips 14, and the plurality of blue LED chips 15.

This step is preferably performed amid electrically connecting the LED chips of respective colors, and the fixed white LED chips 16 are mutually electrically connected or electrically connected to the common substrate 11 via gold wires.

in some embodiments of the present disclosure, phosphorous glue is injected into the areas where the plurality of white LED chips 16 are disposed and cured.

What have been described above are only preferred embodiments of the present disclosure, not intended for limiting the present disclosure. Any modifications, equivalent substitutions, and improvements within the spirit and principle of the present disclosure should be included within the protection scope of the present disclosure.

The invention claimed is:

1. An LED packaging unit, comprising:
   a common substrate; and
   N number of red LED chips, M number of green LED chips, and X number of blue LED chips, the N number of red LED chips, the M number of green LED chips, and the X number of blue LED chips being arranged and packaged on the common substrate;
   wherein:
      the red LED chips, the green LED chips, and the blue LED chips are all monochromatic LED chips, with N, M, and X being integers greater than 1;
      distances between any two adjacent said red LEDs chip are substantially consistent, distances between any two adjacent said green LED chips are substantially consistent, and distances between any two adjacent said blue LED chips are substantially consistent; and
      the red LED chips, the green LED chips, and the blue LED chips are arranged in a manner such that the sum of the distances from any of the LED chips of a first color to the LED chips of the second color and the third color immediately adjacent thereto is equal to the sum of the distances from any of the LED chips of a second color to the LED chips of the first color and third color immediately adjacent thereto; and wherein;
      the LED packaging unit further comprises a plurality of electrode contacts, and respective LED chips are correspondingly connected, with uniform wiring, to the plurality of electrode contacts.

2. The LED packaging unit according to claim 1, wherein the common substrate is shaped with a recess, wherein the red LED chips, the green LED chips, and the blue LED chips are arranged and packaged on a substantially flat bottom surface of the recess.

3. The LED packaging unit according to claim 2, wherein the size of the bottom surface of the recess is equal to or less than 25 mm$^2$, or preferably 8-25 mm$^2$.

4. The LED packaging unit according to claim 2, wherein the bottom surface of the recess is partitioned into N number, M number and X number of areas for accommodating the N number of red LED chips, the M number of green LED chips and the X number of blue LED chips, respectively, wherein each said LED chip is disposed at the center of its corresponding area.

5. The LED packaging unit according to claim 4, wherein the range of size A of each of the areas is defined by the equation below:

$$A = S1/(N+M+X)*(70\%\sim130\%);$$

where N, M, and X respectively refer to the number of red LED chips, the number of green LED chips, and the number of blue LED chips; and S1 refers to the size of the bottom surface of the recess.

6. The LED packaging unit according to claim 2, wherein the N number of red LED chips are spaced from each other and arranged into a first row; the M number of green LED chips are spaced from each other and arranged into a second row; the X number of blue LED chips are spaced from each other and arranged into a third row, wherein the first row, the second row, and the third row are spaced apart and substantially arranged abreast.

7. The LED packaging unit according to claim 6, wherein the first row is disposed above the second row, and the second row is disposed above the third row.

8. The LED packaging unit according to claim 6, wherein Y number of white LED chips is arranged on the bottom surface, where Y is an integer greater than or equal to 1.

9. The LED packaging unit according to claim 6, wherein the bottom surface is provided with a fourth row of white LED chips, and wherein the fourth row is disposed below the first, second and third rows, and is spaced apart from the first, second, and third rows and arranged substantially abreast.

10. The LED packaging unit according to claim 1, wherein:
    the distances from respective red LED chips to corresponding green LED chips immediately adjacent thereto are substantially consistent;
    the distances from respective red LED chips to corresponding blue LED chips immediately adjacent thereto are substantially consistent; and
    the distances from respective green LED chips to corresponding blue LED chips immediately adjacent thereto are substantially consistent.

11. The LED packaging unit according to claim 1, wherein the maximum straight-line distances from any of LED chips of one color to the LED chips of the other two colors immediately adjacent thereto is within a range of 0.2 mm ~2 mm.

12. The LED packaging unit according to claim 1, wherein the N is 6, the M is 4, and the X is 4.

13. The LED packaging unit according to claim 1, wherein the N is 4, the M is 3, and the X is 3.

14. The LED packaging unit according to claim wherein, each said LED chip is provided a first electrode contact arranged at a top thereof, and correspondingly a second electrode arranged at a bottom thereof, and the LED chips of the same color are connected together in series via the plurality of the electrode contacts.

15. The LED packaging unit according to claim wherein the widths of the plurality of electrode contacts are different from each other, and the number of LED chips connected to respective electrode contacts is substantially proportional to the width of the electrode contact.

16. The LED packaging unit according to claim 15, wherein the range of width the electrode contact CL is defined by the equation below:

$$CL = \frac{L-d}{x} * n * (70\%\sim130\%)$$

where x denotes the total number of LED chips;
L denotes the length of the edge where all electrode contacts where all electrode contacts are sitting on;
d denotes the dimension of blank space between two adjacent electrode contacts; and
n denotes the number of LED chips included in each individual electrode contact area.

17. The LED packaging unit according to claim 1, wherein the electrode contacts protrude from the packaging unit acting as heat dissipation contact for facilitating heat dissipation.

18. The LED lamp according to claim 17, comprising a polygonal panel, and a circuit board adapted to the profile of the panel and arranged together with the panel; wherein a plurality of the LED packaging units are disposed at corresponding corners of the panel and electrically connected to the circuit board.

19. The LED lamp according to claim 18, wherein at a backlight position of each of the LED packaging units on the panel is formed a corner dark area, the size of said corner dark area configured to be essentially invisible to naked eyes when the lamp is energized in an luminous state, or configured to an extent in which the naked eyes can only perceive a dark point or a dark strip.

20. The LED lamp according to claim 19, wherein the size of said corner dark area of is less than or equal to about 7 mm$^2$, preferably less than or equal to about 5 mm$^2$.

21. The LED lamp according to claim 17, wherein the one or more LED packaging units are configured to be mounted in an inclined manner at so as to reduce the overlapping area of the light emitted from two adjacent said LED packaging units.

22. An LED lamp, comprising one or more LED packaging unit according to claim 1.

23. The LED lamp according to claim 22, wherein the LED lamp is an LED panel lamp.

24. A method for manufacturing a LED packaging unit as claimed in claim 1, comprising:

providing a common substrate, wherein a recess is formed on the common substrate, the size of the bottom surface of the recess being equal to or less 25 mm$^2$, or preferably 8-25 mm$^2$; and arranging and packaging a plurality of red LED chips, a plurality of green LED chips, and a plurality of blue LED chips on the common substrate, such that the sum of the distances from any of the LED chips of a first color to the LED chips of second color and third color immediately adjacent thereto is substantially approximate to or equal to the sum of the distances from any of the LED chips of the second color to the LED chips of the first color and third color immediately adjacent thereto.

25. The method according to claim 24, further comprising:

arranging and packaging a plurality of white LED chips on the common substrate in such a manner that the plurality of white LED chips are isolated from the plurality of red LED chips, the plurality of green LED chips, and the plurality of blue LED chips.

* * * * *